(12) United States Patent
Joodaki et al.

(10) Patent No.: US 7,154,340 B2
(45) Date of Patent: Dec. 26, 2006

(54) CIRCUIT FOR INCREASING THE UNITY GAIN CROSSOVER FREQUENCY OF AN AMPLIFIER ELEMENT

(75) Inventors: Mojtaba Joodaki, Heilbronn (DE); Juergen Berntgen, Bad Rappenau (DE); Peter Brandl, Sulzfeld (DE); Christoph Bromberger, Heilbronn (DE); Brigitte Kraus, Flein (DE)

(73) Assignee: ATMEL Germany GmbH, Heilbronn (DE)

( * ) Notice: Subject to any disclaimer, the term of this patent is extended or adjusted under 35 U.S.C. 154(b) by 127 days.

(21) Appl. No.: 11/094,523

(22) Filed: Mar. 31, 2005

(65) Prior Publication Data
US 2005/0218995 A1 Oct. 6, 2005

(30) Foreign Application Priority Data
Apr. 1, 2004 (DE) ............ 10 2004 017 165

(51) Int. Cl.
*H03F 3/04* (2006.01)
(52) U.S. Cl. ............ 330/311; 330/288; 330/310; 330/98
(58) Field of Classification Search ........ 330/311, 330/288, 310, 98
See application file for complete search history.

(56) References Cited

U.S. PATENT DOCUMENTS

| | | | |
|---|---|---|---|
| 4,586,004 A * | 4/1986 | Valdez | 330/300 |
| 6,114,913 A * | 9/2000 | Entrikin | 330/308 |
| 6,724,257 B1 * | 4/2004 | Wrathall | 330/253 |
| 6,861,909 B1 * | 3/2005 | Kobayashi | 330/311 |
| 7,091,788 B1 * | 8/2006 | Glass et al. | 330/296 |

FOREIGN PATENT DOCUMENTS

| | | |
|---|---|---|
| DE | 35 14 052 A1 | 10/1986 |
| DE | 101 28 570 A1 | 1/2002 |

OTHER PUBLICATIONS

Tietze, Ulrich, Schenk, Christoph: "*Halbleiter-Schaltungstechnik*," 9th edition, Berlin, u.a., Springer-Verlag, 1990, pp. 64, 65, and 492.

* cited by examiner

Primary Examiner—Patricia Nguyen
(74) Attorney, Agent, or Firm—McGrath, Geissler, Olds & Richardson, PLLC

(57) ABSTRACT

A circuit having an input amplifier and a second amplifier that provides the circuit with a unity gain crossover frequency that is higher than a unity gain crossover frequency of the input amplifier is provided. The circuit has a control input coupled to a control input of the input amplifier and also has a first current connection and a second current connection. The circuit further includes an additional amplifier that is connected in series with the second amplifier and is controlled by the input amplifier.

13 Claims, 4 Drawing Sheets

CIRCUIT FOR INCREASING THE UNITY GAIN CROSSOVER FREQUENCY OF AN AMPLIFIER ELEMENT

This nonprovisional application claims priority under 35 U.S.C. § 119(a) on German Patent Application No. DE 1020040171653, which was filed in Germany on Apr. 1, 2004, and which is herein incorporated by reference.

BACKGROUND OF THE INVENTION

1. Field of the Invention

The present invention relates to a circuit having an input amplifier and a second amplifier that provides the circuit with a unity gain crossover frequency that is higher than a unity gain crossover frequency of the input amplifier. The circuit further includes a control input being coupled to a control input of the input amplifier and also includes a first current connection and a second current connection.

2. Description of the Background Art

A unity gain crossover frequency of an amplifier element is understood by one skilled in the art to mean the frequency at which its frequency-dependent amplification, e.g., a quotient of an output current value and input current value, drops to a value of one. A circuit of this nature, also known as a unity gain crossover frequency multiplier or unity gain crossover frequency doubler, is known per se. In this context, the term multiplier is to be interpreted such that increases in the unity gain crossover frequency by non-integer factors <1 is also considered to be multiplication.

As an example of such a circuit that is known per se, reference is made to a cascode such as is described in Tietze-Schenk, Halbleiter-Schaltungstechnik, $9^{th}$ edition, Springer Verlag, p. 492. This cascode has an input amplifier in the form of a bipolar transistor connected in a common-emitter circuit, the collector of which is coupled to the emitter of a second transistor that is connected in a common-base circuit. The coupling with the second transistor in a common-base circuit eliminates the Miller effect.

However, unity gain crossover frequency multipliers can also be realized using other circuit topologies having normal bipolar transistors, SiGe heterojunction bipolar transistors (SiGe HBT), HBTs made of III/V semiconductors, field-effect transistors and/or operational amplifiers. However, this listing of transistor types makes no claim to completeness and thus is not to be construed as limiting.

In the most general sense, the primary advantage of unity gain crossover frequency multipliers is that they can replace amplifier elements, and in particular individual transistors, as separate elements in a high-frequency circuit design.

Despite ongoing development of high-frequency technologies and their diverse applications in the millimeter and sub-millimeter wavelength regions (frequencies in the gigahertz to terahertz range), there are many microwave and optoelectronic applications which demand further improvements in high-frequency characteristics and other electrical characteristics, especially increases in unity gain crossover frequency, improvements in the shape of the gain characteristic, increases in breakdown voltage and power flow through amplifier elements, etc.

SUMMARY OF THE INVENTION

It is therefore an object of the present invention to provide a circuit that further improves high-frequency characteristics such as a unity gain crossover frequency and/or a shape of the gain characteristic and/or other electrical characteristics, for example, a breakdown voltage of an amplifier element, etc.

This object is attained in a circuit that has an additional amplifier that is connected in series with a second amplifier and is controlled by an input amplifier.

In comparison with a circuit without such an additional amplifier, it has been demonstrated that a shape of an amplification curve of the circuit according to an example embodiment, plotted over current flow through the circuit is flatter and more rectangular on the whole, and that the new circuit has an increased breakdown voltage and unity gain crossover frequency.

According to an example embodiment, the circuit has a node coupled with a second current connection of the input amplifier and a first current connection of the second amplifier. A first current connection of the input amplifier being coupled through the additional amplifier to a first current connection of the circuit, and a second current connection of the additional amplifier being connected to the node.

In addition, the input amplifier can have at least one transistor and/or one operational amplifier.

It is a great advantage of the invention that the advantages achieved with regard to high frequency characteristics and electrical characteristics are not limited to a special input amplifier circuit, but instead are largely independent of the concrete embodiment of the input amplifier with transistors and/or operational amplifiers.

In a further example embodiment, the additional amplifier has a current mirror with at least one second transistor and a diode, wherein a first current connection of the input amplifier can be connected to a control connection of the second transistor and is connected through the diode to a first current connection of the second transistor. Also, a second current connection of the input amplifier can be connected to a second current connection of the second transistor.

The input amplifier and the second transistor can be a bipolar transistor that has a base as a control input, an emitter as a first current connection, and a collector as a second current connection. The second amplifier element can also have at least one transistor.

Generally speaking, the unity gain crossover frequency is limited by a transit time of charge carriers through components as well as by parasitic capacitances of the components. Thus, a few of the advantageous aspects of the invention are exhibited when the limitation of unity gain crossover frequency is dominated less by transit time effects and more by parasitic capacitances. Since this is generally the case with bipolar transistors, the invention produces an especially pronounced increase in the unity gain crossover frequency for these components. However, it is a matter of course that the invention is not limited to an implementation with bipolar transistors, but also permits implementation with other transistor types, with MOSFET, JFET (junction FET), HFET (heterostructure FET), etc. serving as examples, but this list is by no means complete.

The second amplifier can also be implemented as a common-base circuit of a third transistor.

Such a common-base circuit of a third transistor at the output of the unity gain crossover frequency multiplier reduces the increase in the circuit's input capacitance expected due to the Miller effect. Moreover, since only a single transistor can be used as the output with the third transistor, the output capacitance is likewise reduced. Furthermore, this structure has improved electrical isolation between input and output. As a result of the common-base circuit of the third transistor, the overall circuit exhibits a lower output conductance on the whole.

Nonetheless, these advantages in the example embodiment having the common-base circuit of the third transistor are achieved at the cost of a high current gain and with high MSG slope (MSG=maximum stable gain) over frequency, which is undesirable per se. Although the MSG is sharply improved at low frequencies, as in other 2-stage amplifiers it drops twice as fast as in the case of a single-stage amplifier. This not only limits the frequency response, but also causes problems in circuit design.

In order to avoid these problems as well, a further example embodiment can have an additional amplifier that has the topology of the remainder of the circuit excluding the additional amplifier.

Further, the second amplifier can have a fourth transistor, and a second current mirror including a fifth transistor and a second diode. Whereby, a first current connection of the fourth transistor can be connected to a control connection of the fifth transistor and can be connected through the second diode to a first current connection of the fifth transistor. Also, a second current connection of the fourth transistor can be connected to a second current connection of the fifth transistor.

In comparison to a single third transistor in a common-base circuit as an additional amplifier, these structures result in a much smaller input value for the frequency-determining product of resistance and capacitance, leading to slopes in the current gain and maximum stable gain over frequency which have similar flatness to the corresponding curves of a single-stage amplifier.

The input amplifier and the second transistor can each be implemented as SiGe heterojunction transistors.

An SiGe heterojunction transistor of this nature is characterized by a thin, p-doped SiGe layer as a base layer. Consequently, the active base layer can be kept very thin, which reduces the transit time of charge carriers and thus increases the unity gain crossover frequency. SiGe heterojunction transistors are thus especially suitable for increasing the unity gain crossover frequency in conjunction with the invention. Nonetheless, it is a matter of course that the invention also exhibits its advantages in conjunction with other transistor types.

In a further example embodiment, a total base-emitter capacitance of the second amplifier is dimensioned such that the total base-emitter capacitance corresponds to the capacitance of a series connection of two base-emitter capacitances of a single transistor.

In this case the total output capacitance is of two parallel collector capacitances, which, while it does reduce the MSG, leads to an advantageously reduced MSG slope over frequency for higher frequencies. This is one example of the desired improvement in the shape of the gain characteristic.

Also, the third transistor can be an SiGe heterojunction transistor.

This example embodiment results in similar advantages to those mentioned above in connection with corresponding implementations of a first and a second transistor.

In similar fashion to this embodiment of the third transistor, there is also an example embodiment with an implementation of the fourth and/or fifth transistor as SiGe heterojunction transistor.

This embodiment is characterized by an especially high output voltage amplitude that is useful for a variety of applications. The advantage further obtains that the curve of MSG over frequency has a slope resembling the slope of a single-stage amplifier. This makes possible structures with higher DC gain, higher output conductance, higher breakdown voltage, higher controllable power flow, and higher unity gain crossover frequency, which can be used simply in place of a single transistor.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1A:
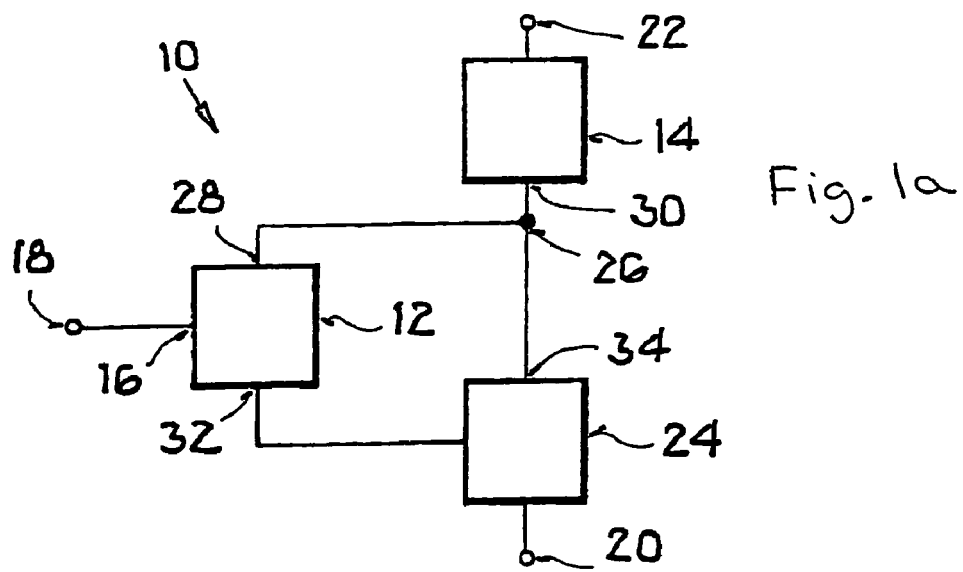
FIGS. 1a–c are schematic representations of example embodiments of the invention.

FIG. 1a shows a circuit 10 with an input amplifier 12 and a second amplifier 14 that provides the circuit 10 with a unity gain crossover frequency that is higher than a unity gain crossover frequency of the input amplifier 12. The circuit 10 also has a control connection 18 coupled to a control input 16 of the input amplifier 12 and also has a first current connection 20 and a second current connection 22. In addition, the circuit 10 has an additional amplifier 24 that is connected in series with the second amplifier 14 and is controlled by the input amplifier 12. A node 26 is coupled with a second current connection 28 of the input amplifier 12 and a first current connection 30 of the second amplifier 14. A first current connection 32 of the input amplifier 12 is coupled through the additional amplifier 24 to the first current connection 20 of the circuit 10, and a second current connection 34 of the additional amplifier 24 is connected to the node 26.

Figure 1B:
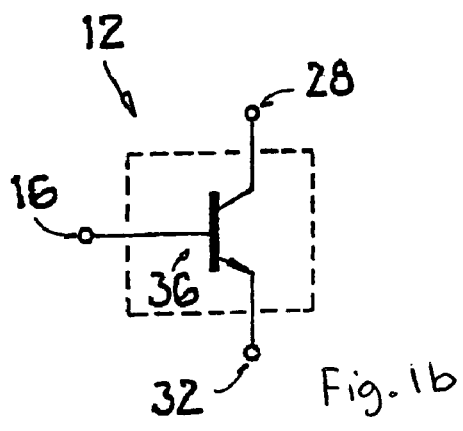

The input amplifier 12 preferably has at least one transistor 36 and/or one operational amplifier. FIG. 1b shows a schematic illustration of the first transistor 36. It is a matter of course that the input amplifier can also have a network of transistors and/or operational amplifiers.

Figure 1C:
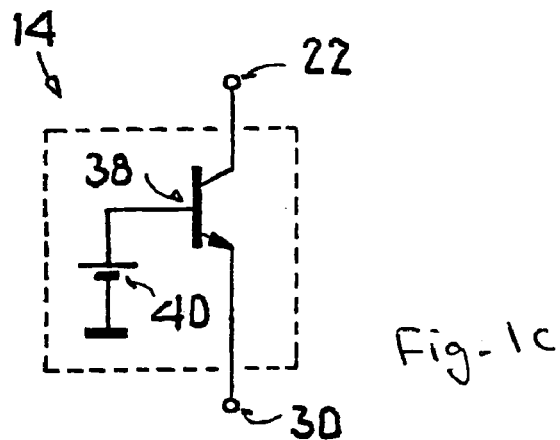

In an example embodiment of the second amplifier 14 that is shown in FIG. 1c, the second amplifier 14 includes a third transistor 38 in a common-base circuit, wherein its base is coupled to a DC control current source 40, its emitter serves as first current connection 30, and its collector serves as second current connection 22 of the circuit 10.

With the control connection 18, the first current connection 20, and the second current connection 22, the circuit 10 has, in particular, the same number of connections as a single transistor.

Figure 2:
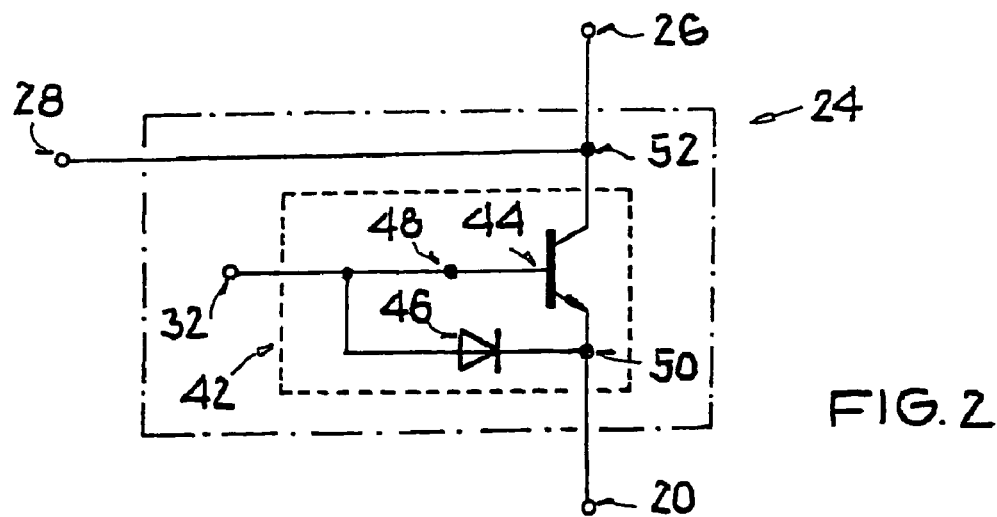
FIG. 2 is an example embodiment of another amplifier that results in an increase in the unity gain crossover frequency.

FIG. 2 shows an example embodiment of the additional amplifier 24. In accordance therewith, the additional amplifier 24 can have a current mirror 42 having a second transistor 44 and a diode 46, wherein the first current connection 32 of the input amplifier 12 from FIG. 1 is connected to a control connection 48 of the second transistor 44 and is connected through the diode 46 to a first current connection 50 of the second transistor 44, and wherein a second current connection 52 of the second transistor 44 is connected to node 26 from FIG. 1. The first current connection 50 of the second transistor 44 leads to the first current connection 20 of the circuit 10 from FIG. 1. A circuit including the additional amplifier 24 from FIG. 2 in connection with an input amplifier 12 from FIG. 1 and/or FIG. 1b provides an increased unity gain crossover frequency as compared to the input amplifier 12.

The second transistor 44 can also be implemented, for example, as a bipolar transistor with a base as control input 48, an emitter as first current connection 50, and a collector as second current connection 52.

In this structure of the additional amplifier 24 within the circuit 10 from FIG. 1, an input signal fed into the circuit 10 through the external control connection 18 modulates a current flowing through the second current connection 22 of the circuit 10 whose current amplitude serves as the output signal of the circuit 10. In this regard, the circuit 10 behaves like an individual transistor with increased values of unity gain crossover frequency and breakdown voltage as well as a reduced output conductance, and can be used in a high-frequency circuit in place of an individual transistor.

Figure 3:
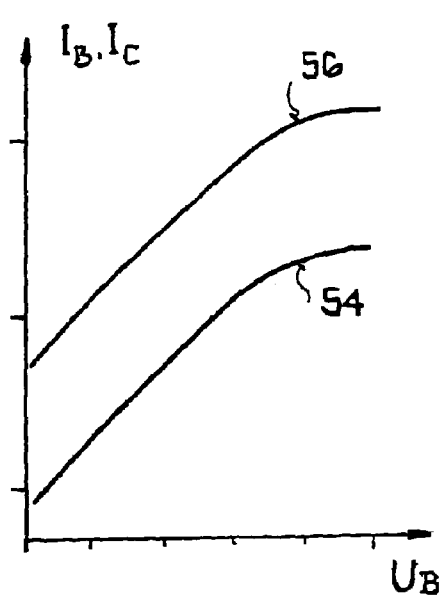
FIG. 3 shows Gummel plots for a unity gain crossover frequency multiplier having an input amplifier and an additional amplifier from FIG. 2.

FIG. 3 illustrates Gummel plots for a unity gain crossover frequency multiplier including the input amplifier 12 and the current mirror 42. As is known, the Gummel plot results from a measurement at a collector-base voltage=0 and a varying base-emitter voltage, wherein the base current $I_B$ and the collector current $I_C$ are plotted logarithmically as a function of the linearly plotted base voltage $U_B$. The largely linear progression of the curves 54 (control current through connection 18) and 56 (collector current through connection 22) is qualitatively similar to the corresponding curve shapes for an individual transistor, thus confirming that the circuit 10 can replace an individual transistor.

Figure 4:
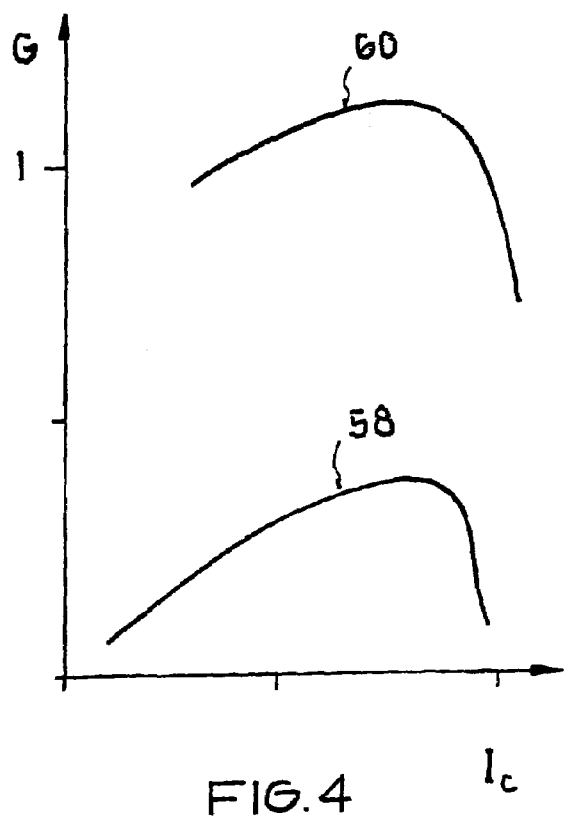
FIG. 4 shows DC gains for a unity gain crossover frequency multiplier and an individual transistor plotted logarithmically over a collector current.

FIG. 4 represents the DC gains G for a unity gain crossover frequency multiplier including input amplifier 12 and additional amplifier 24 from FIG. 2 as well as for an individual transistor over the logarithmically plotted collector current $I_C$. The number 58 here designates a G curve for the individual transistor, while the number 60 designates the corresponding curve for the unity gain crossover frequency multiplier including input amplifier 12 and additional amplifier 24 from FIG. 2. As can be seen, the DC gain of this unity gain crossover frequency multiplier has a shape that qualitatively resembles that of the individual transistor, likewise confirming their fundamental interchangeability. The unity gain crossover frequency multiplier here has the property that its DC gain characteristic 60 is significantly higher than the DC gain characteristic 58 of the individual transistor.

Figure 5:
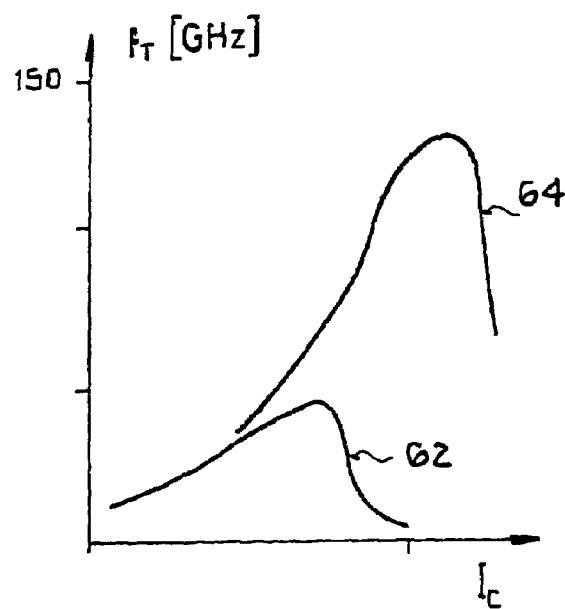
FIG. 5 show corresponding curves of the unity gain crossover frequency $f_T$ over collector currents $I_C$.

FIG. 5 shows corresponding curves of unity gain crossover frequency $f_T$ over collector currents $I_C$. The curve 62 here belongs to an individual transistor, and the curve 64 belongs to a unity gain crossover frequency multiplier including input amplifier 12 and current mirror 42. FIG. 5 shows the significantly higher unity gain crossover frequency of the unity gain crossover frequency multiplier including input amplifier 12 and current mirror 42 as compared to an individual transistor.

Figure 6:
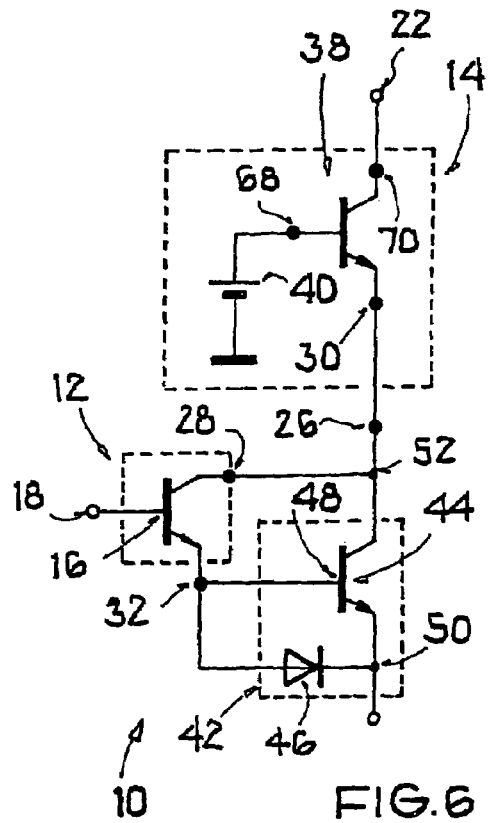
FIG. 6 is a first example circuit embodiment of the invention with an additional third transistor as an additional amplifier.

FIG. 6 shows an example embodiment of an inventive circuit 10 which combines the features of FIGS. 1b, 1c, and FIG. 2 in accordance with the general representation in FIG. 1a.

In accordance therewith, this embodiment uses the third transistor 38, in particular, as additional amplifier element 14, the base connection 68 of which belongs both to its emitter-side connection 30 and its collector-side connection 70, thus constituting a common-base circuit. The DC source 40 is connected to the base connection 68. Node 70 leads to the second current connection 22 of the circuit 10.

The addition of the third transistor 38 in a common-base circuit at node 26 of the unity gain crossover frequency multiplier including input amplifier 12 and current mirror 42 reduces the input capacitance of this unity gain crossover frequency multiplier increased by the Miller effect, and additionally reduces the output capacitance of the overall circuit 10, since only a single third transistor 38 is used as the output. Moreover, the circuit 10 has better isolation between input 18 and second current connection 22. As a result of the common-base circuit of the transistor 38 at the node 26, the output conductance of the structure is sharply improved.

Figure 7:
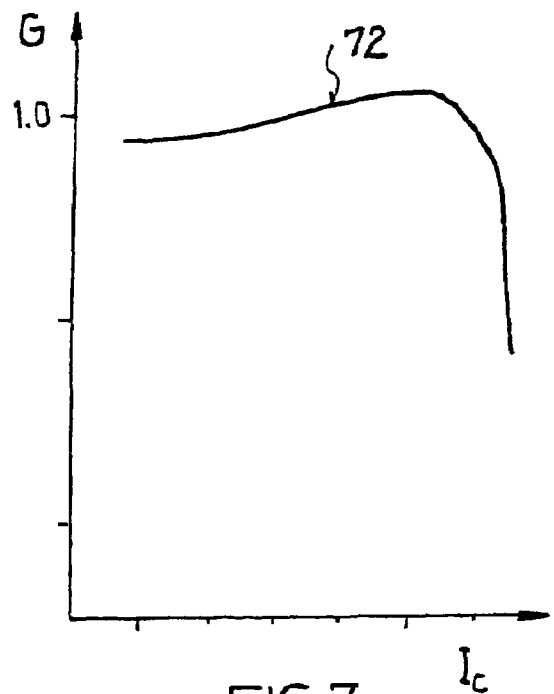
FIG. 7 shows a DC gain of the circuit from FIG. 6.

FIG. 7 shows the DC gain G of the circuit 10 from FIG. 6 over the collector current $I_C$ flowing at node 70, as the curve 72.

Figure 8:
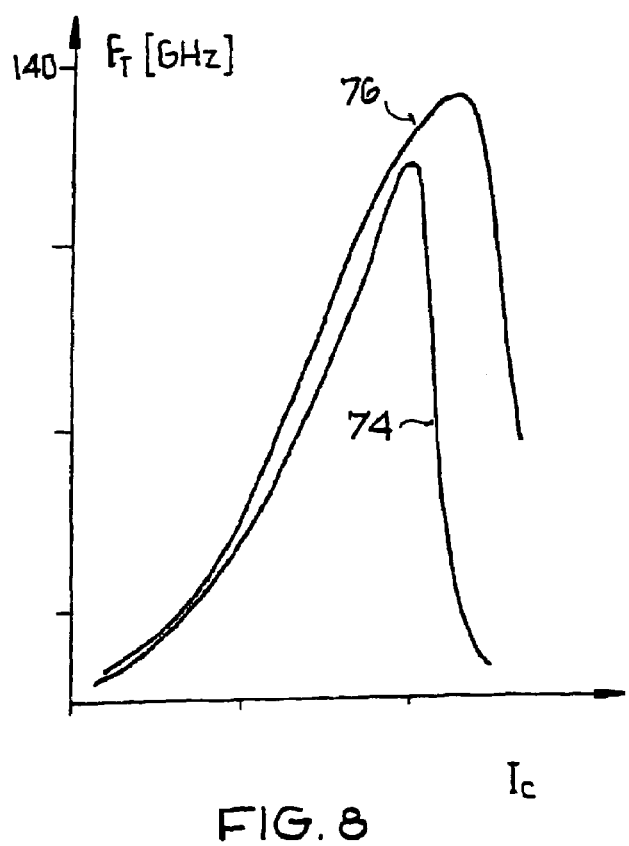
FIG. 8 are curves of the unity gain crossover frequency $f_T$ over the entire collector current $I_C$ for the circuit from FIG. 6 in comparison to a corresponding curve for a unity gain crossover frequency multiplier having an input amplifier and the circuit from FIG. 2.

FIG. 8 shows a corresponding curve 74 of the unity gain crossover frequency $f_T$ over the total collector current $I_C$ for the circuit 10 from FIG. 6 as compared with a corresponding curve for the unity gain crossover frequency multiplier including input amplifier 12 and current mirror 42.

Here, the curve 74 belongs to a circuit 10 with a third transistor 38, while the curve 76 corresponds to the curve produced by the aforementioned unity gain crossover frequency multiplier solely having input amplifier 12 as in FIG. 1b and current mirror 42, which is to say without third transistor 38. As can be seen, the curve 74 of the overall circuit 10 lies below the curve 76 of the aforementioned unity gain crossover frequency multiplier alone. This effect, which is disadvantageous in itself, is overcompensated, however, by a more favorable MSG/MAG curve as is discussed below. The aforementioned intrinsically disadvantageous effect proves, however, that the desirable characteristics of a circuit do not result simply from complementing the known cascode with an additional unity gain crossover frequency multiplier.

Figure 9:
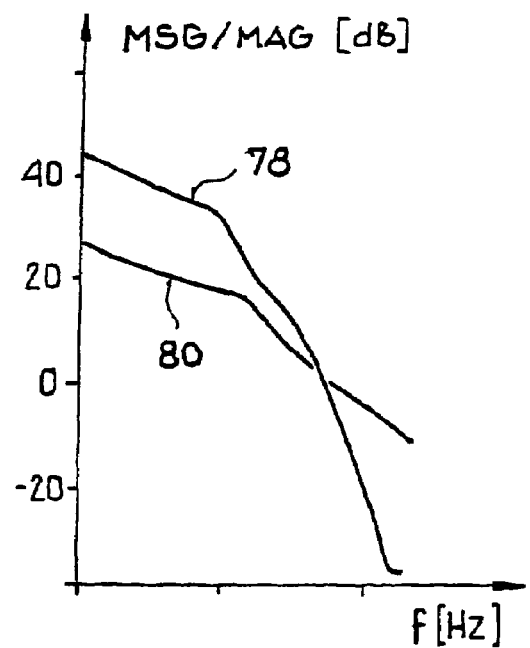
FIG. 9 is an MSG/MAG curve (MAG=maximum available gain) over frequency for an implementation of the additional amplifier by a third transistor, and an MSG/MAG curve for the unity gain crossover frequency multiplier having an input amplifier and the circuit from FIG. 2.

FIG. 9 shows an MSG/MAG curve 78 over frequency for the embodiment with a third transistor 38 and an MSG/MAG curve 80 for the aforementioned unity gain crossover frequency multiplier alone, which is to say without third transistor 38.

According to FIG. 9, the circuit 10 from FIG. 6 produces higher gains (curve 78), hence higher collector currents over frequency, than is the case for the aforementioned unity gain crossover frequency multiplier without the third transistor 38 (curve 80), where the amplification plotted over frequency does not drop until higher frequencies. This advantageous behavior is caused by the improved output conductance of the circuit 10 from FIG. 6, which is higher than that of the aforementioned unity gain crossover frequency multiplier without third transistor 38.

Figure 10:
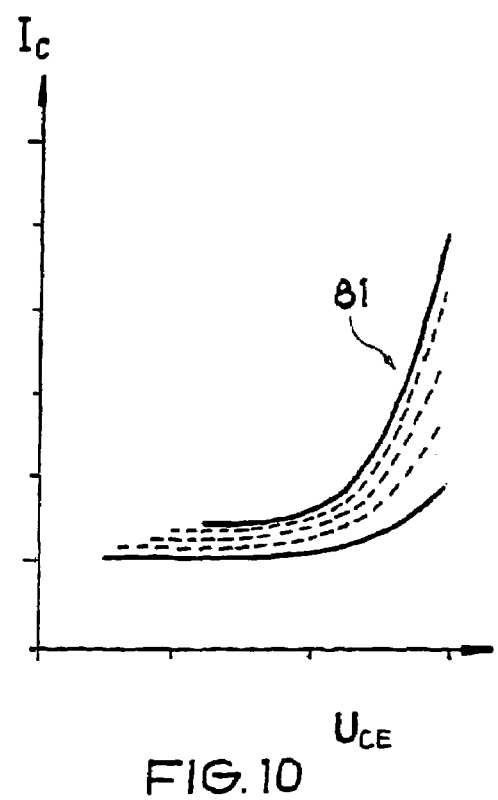
FIG. 10 shows curves of a collector current over a collector voltage for the circuit according to FIG. 6.

The output characteristic, thus the curve of collector current $I_C$ over collector voltage $U_{CE}$, is shown in FIG. 10 by the family of characteristic curves 81 for the circuit 10 from FIG. 6. As can be seen, the circuit 10 from FIG. 6 results in a high output voltage amplitude. The circuit 10 from FIG. 6 thus provides a significantly improved MSG overall and a good output voltage amplitude with a unity gain crossover frequency that is still very high.

It is also advantageous that the circuit 10 with a third transistor 38 in a common-base circuit has an MSG slope over frequency that resembles that of a single-stage amplifier at low frequencies. This is a great advantage for high frequency applications relating to frequency ranges below 10 GHz.

Nonetheless, these advantages are achieved at the cost of a high current gain and with undesirably steeper MSG curves over frequency. Although the MSG is sharply improved at low frequencies, as in all other 2-stage amplifiers it drops twice as fast as in the case of a single-stage amplifier. This not only limits the frequency response, but may also causes problems in circuit design.

Figure 11:
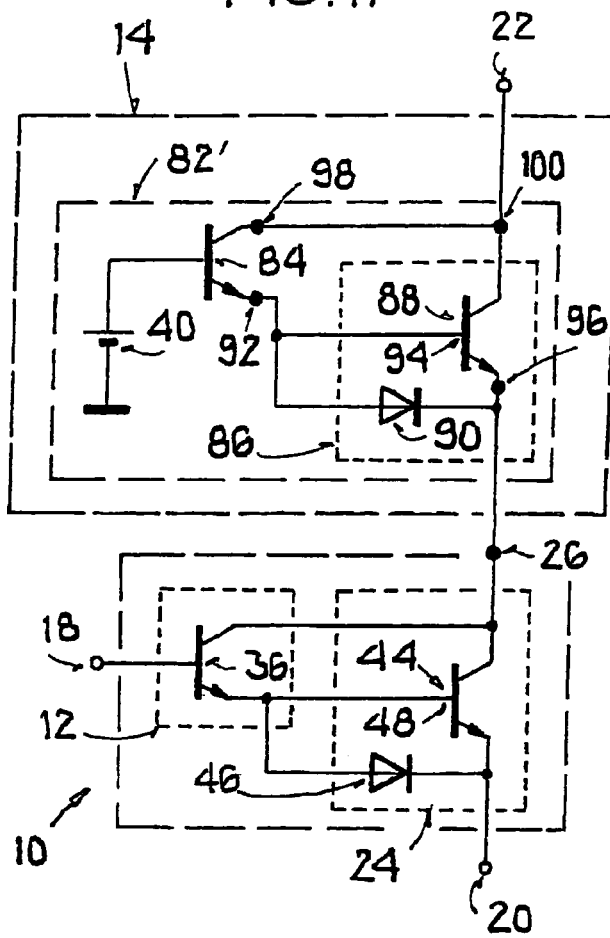
FIG. 11 is an additional, example circuit embodiment of the invention with an alternative implementation of the additional amplifier.

As a remedy, another example embodiment of the invention provides that the second amplifier 14 is implemented by an additional unity gain crossover frequency multiplier 82 that has the same circuit topology as the remainder of the circuit including input amplifier 12 and additional amplifier 24. Such an example embodiment is shown in FIG. 11. In particular, FIG. 11 shows a circuit 10 with an input amplifier 12 in the embodiment from FIG. 1b and an additional amplifier 24 of the embodiment from FIG. 2, thus with an input amplifier 12 having a first transistor 36 and a current mirror 42 including second transistor 44 and diode 46. The current mirror 42 here is thus identical to the additional amplifier 24.

The second amplifier 14 has a fourth transistor 84, a second current mirror 86 of a fifth transistor 88 and a second diode 90. A first current connection 92 of the fourth transistor 84 is connected to a control connection 94 of the fifth transistor 88 and also is connected through the second diode 90 to a first current connection 96 of the fifth transistor 88. A second current connection 98 of the fourth transistor 84 is connected to a second current connection 100 of the fifth transistor 88.

It is proposed for such a structure that a base-emitter capacitance of the second amplifier 14 be equal to two series base-emitter capacitances of an individual transistor. In this case, the total output capacitance includes two parallel collector capacitances, which, while it does reduce the MSG and is undesirable per se, advantageously leads to a reduced MSG slope over frequency for higher frequencies, resulting in a curve that in a certain sense is more rectangular overall with a pronounced flat section.

Figure 13:
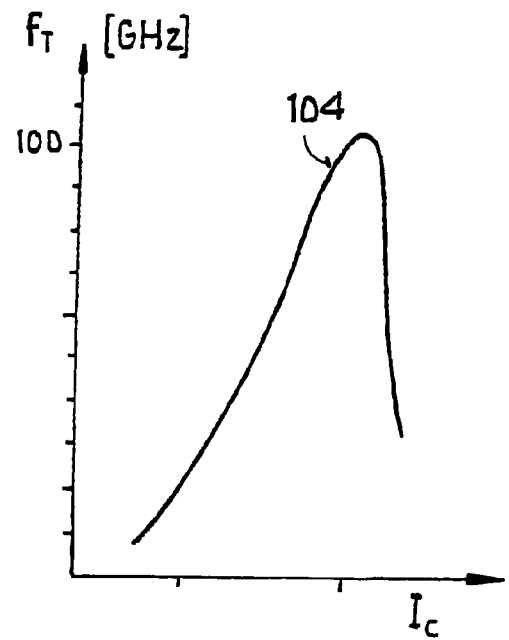
FIG. 13 illustrates unity gain crossover frequencies over the entire collector current for the example embodiment from FIG. 11.
Figure 12:
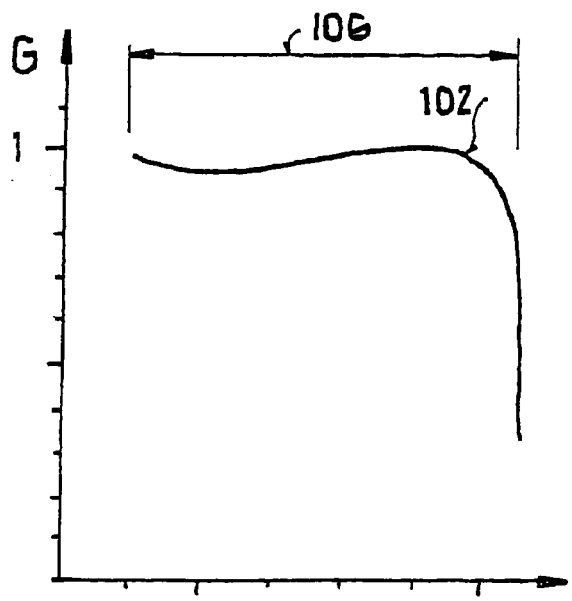
FIG. 12 shows a DC gain for designs of the example embodiment from FIG. 11.

FIGS. 12 and 13 illustrate resulting curves of DC gain G (curve 102) and the unity gain crossover frequency $f_T$ (curve 104) over the total collector current $I_C$ for this embodiment with a unity gain crossover frequency multiplier 82 as second amplifier 14. As intended, the embodiment from FIG. 11 likewise has an approximately rectangular G curve 102 with a pronounced flat section 106.

Figure 14:
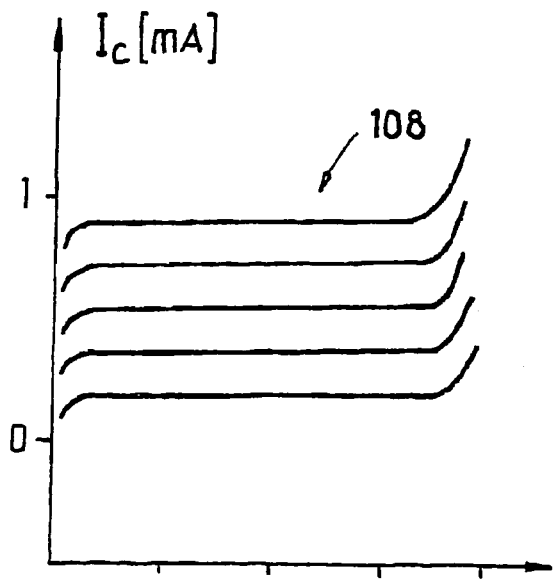
FIG. 14 is a graph of the dependence of the collector current on the collector-emitter voltage with the base current as a parameter for the example embodiment from FIG. 11.

FIG. 14 shows the output characteristics 108, hence the dependence of the collector current $I_C$ on the collector-emitter voltage $U_{CE}$ with the base current as a parameter for the example embodiment from FIG. 11. This embodiment provides an output voltage amplitude of over 8 volts, which is useful for a variety of applications.

Comparison of the MSG/MAG curves of the designs with two frequency multipliers, hence of designs of the example embodiment from FIG. 11, with corresponding curves of example embodiments having a single third transistor 38 as in FIG. 6 has shown that, while the design with two frequency multipliers does have a somewhat poorer MSG at low frequencies, in exchange it has a flatter slope that more closely resembles the slope of a curve for a single-stage amplifier than is the case for the design with the third transistor 38.

The higher MSG slope of the subject of FIG. 6 as compared to the subject of FIG. 11 leads not only to lower MSG values but may also causes problems in broadband circuits. These problems are avoided by the subject of FIG. 11 and its generalized topology.

The design with two unity gain crossover frequency multipliers having largely identical circuit topology, in particular the subject of FIG. 11, thus permits higher DC gains, higher output conductances, higher breakdown voltages, higher controllable power flows, and higher unity gain crossover frequencies, and can be used simply in place of a single transistor, a situation which also applies to broadband applications.

Additional comparative investigations have shown that the example embodiments of the invention from FIGS. 6 and 11 have significantly higher DC gain and unity gain crossover frequency as compared to the prior art circuit from FIG. 1. Overall, individual embodiments of the invention with the available $SiGe_2$ technology have made it possible to achieve a unity gain crossover frequency of over 107 GHz, a voltage amplitude of over 7 volts, and a very high output conductance.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A circuit comprising:
   an input amplifier; and
   a second amplifier that provides the circuit with a unity gain crossover frequency that is higher than a unity gain crossover frequency of the input amplifier, wherein the circuit includes a control connection coupled to a control input of the input amplifier and also includes a first current connection and a second current connection, and wherein the circuit has an additional amplifier that is connected in series with the second amplifier and is controlled by the input amplifier.

2. The circuit according to claim 1, wherein the circuit has a node being coupled with a second current connection of the input amplifier and a first current connection of the second amplifier, wherein a first current connection of the input amplifier is coupled through the additional amplifier to the first current connection of the circuit, and a second current connection of the additional amplifier is connected to the node.

3. The circuit according to claim 1, wherein the input amplifier has at least one transistor and/or one operational amplifier.

4. The circuit according to claim 1, wherein the additional amplifier has a current mirror with at least one second transistor and a diode, wherein a first current connection of the input amplifier is connected to a control connection of the second transistor and is connected through the diode to a first current connection of the second transistor, and wherein a second current connection of the input amplifier is connected to a second current connection of the second transistor.

5. The circuit according to claim 3, wherein the input amplifier and the second transistor are bipolar transistors, each having a base as a control input, an emitter as a first current connection, and a collector as second current connection, and wherein the additional amplifier has at least one transistor.

6. The circuit according to claim 4, wherein the second amplifier is a common-base circuit of a third transistor.

7. The circuit according to claim 1, wherein the second amplifier has the topology of the remainder of the circuit excluding the second amplifier.

8. The circuit according to claim 1, wherein the second amplifier includes a fourth transistor and a second current mirror having a fifth transistor and a second diode, wherein a first current connection of the fourth transistor is connected to a control connection of the fifth transistor and is connected through the second diode to a first current connection of the fifth transistor, and wherein a second current connection of the fourth transistor is connected to a second current connection of the fifth transistor.

9. The circuit according to claim 4, wherein the input amplifier and the second transistor are SiGe heterojunction transistors.

10. The circuit according to claim 8, wherein a total base-emitter capacitance of the second amplifier is dimensioned such that the total base-emitter capacitance corresponds to the capacitance of a series connection of two base-emitter capacitances of a single transistor.

11. The circuit according to claim 6, wherein the third transistor is an SiGe heterojunction transistor.

12. The circuit according to claim 8, wherein the fourth transistor and the fifth transistor are SiGe heterojunction transistors.

13. A circuit comprising:

a first amplifier having a first transistor;

a second amplifier having a second transistor;

a third amplifier having a current mirror, wherein the second amplifier and the third amplifier are connected in series, wherein the first amplifier is electrically connected with third amplifier and with a node formed between the series connection of the second amplifier and the third amplifier, and wherein a unity gain crossover frequency of the circuit is higher than a unity gain crossover frequency of the first amplifier.

* * * * *